(12) United States Patent
Khlat et al.

(10) Patent No.: US 8,189,707 B1
(45) Date of Patent: May 29, 2012

(54) DC OFFSET CORRECTION OF A RADIO FREQUENCY RECEIVER USED WITH A CONTINUOUS TRANSMISSION RADIO FREQUENCY SIGNAL

(75) Inventors: Nadim Khlat, Midi-Pyrenees (FR); David Myara, Toulouse (FR)

(73) Assignee: RF Micro Devices, Inc., Greensboro, NC (US)

( * ) Notice: Subject to any disclaimer, the term of this patent is extended or adjusted under 35 U.S.C. 154(b) by 1056 days.

(21) Appl. No.: 12/117,282

(22) Filed: May 8, 2008

Related U.S. Application Data

(60) Provisional application No. 60/916,890, filed on May 9, 2007.

(51) Int. Cl.
*H04L 27/02* (2006.01)
*H04L 27/04* (2006.01)
*H04L 25/06* (2006.01)
*H04B 1/38* (2006.01)
*H03D 1/00* (2006.01)

(52) U.S. Cl. ........ 375/268; 375/219; 375/300; 375/319; 375/322; 455/73

(58) Field of Classification Search .......... 375/259, 375/219, 268, 295, 300, 316, 320, 317, 319, 375/345, 322; 455/73, 91, 108, 130, 245.1
See application file for complete search history.

(56) References Cited

U.S. PATENT DOCUMENTS

| | | | |
|---|---|---|---|
| 6,745,015 B2 | 6/2004 | Yochem | |
| 7,176,721 B2* | 2/2007 | Ho et al. | 326/82 |
| 7,369,820 B2 | 5/2008 | Rahman | |
| 7,978,788 B2* | 7/2011 | Hui et al. | 375/319 |
| 2005/0255814 A1 | 11/2005 | Song et al. | |
| 2006/0223457 A1* | 10/2006 | Rahman | 455/78 |

OTHER PUBLICATIONS

Notice of Allowance mailed Apr. 14, 2011 regarding U.S. Appl. No. 12/117,269.

* cited by examiner

*Primary Examiner* — Tesfaldet Bocure
(74) *Attorney, Agent, or Firm* — Withrow & Terranova, P.L.L.C.

(57) ABSTRACT

The present invention relates to estimating a direct current (DC) offset of a radio frequency (RF) receiver when an estimated amplitude of a continuous-transmission amplitude-modulated (AM) RF signal is below a first threshold and when the RF receiver is not receiving an RF input signal. The estimated DC offset of the RF receiver may be used to improve RF receiver performance, particularly over temperature and supply voltage variations. Estimating the DC offset of the RF receiver when the estimated instantaneous amplitude of the continuous-transmission AM RF signal is below the first threshold may minimize errors in the estimated DC offset.

25 Claims, 14 Drawing Sheets

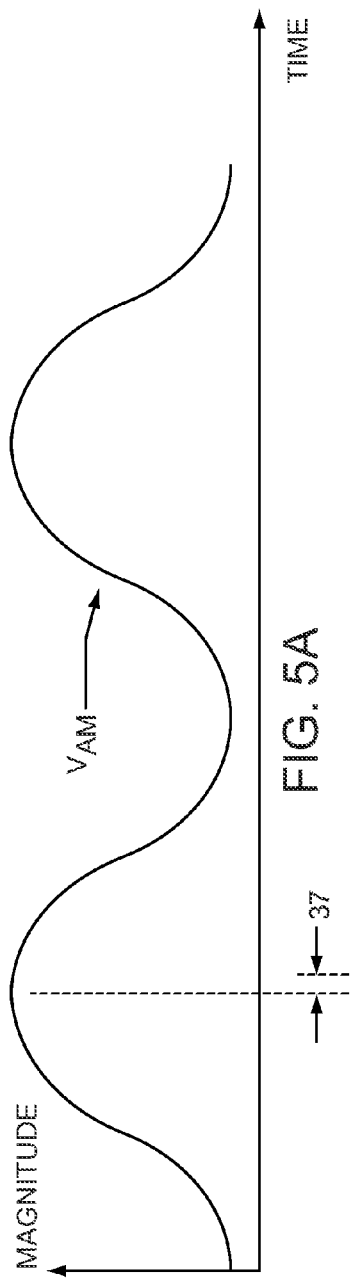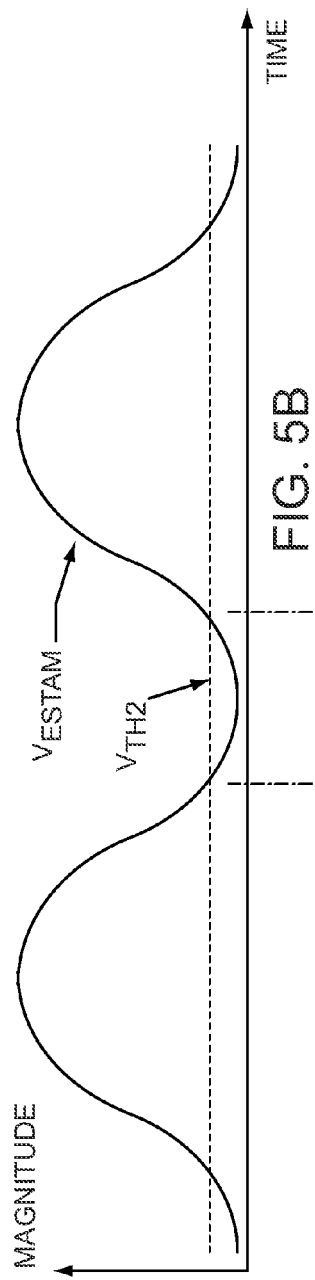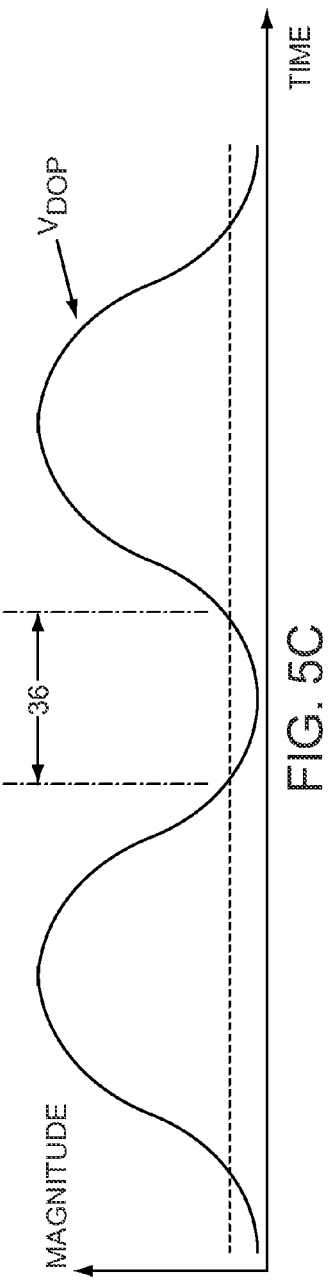

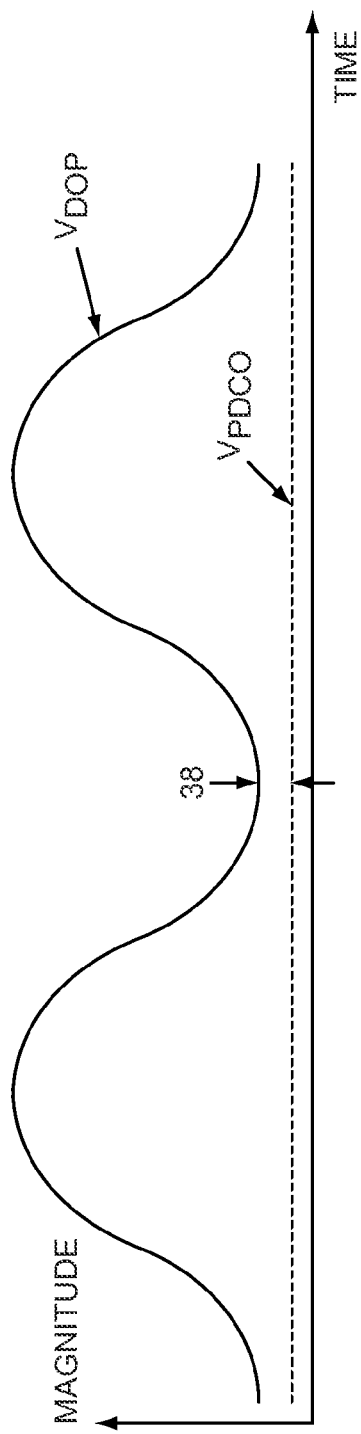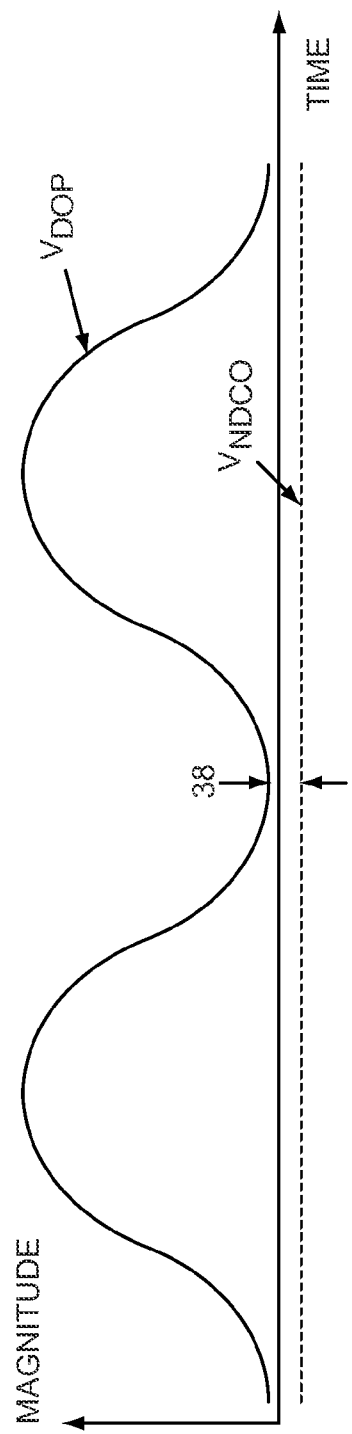

US 8,189,707 B1

DC OFFSET CORRECTION OF A RADIO FREQUENCY RECEIVER USED WITH A CONTINUOUS TRANSMISSION RADIO FREQUENCY SIGNAL

This application claims the benefit of provisional patent application Ser. No. 60/916,890, filed May 9, 2007, the disclosure of which is hereby incorporated herein by reference in its entirety.

FIELD OF THE INVENTION

Embodiments of the present invention relate to direct current (DC) power detectors, radio frequency (RF) transmitters, and RF receivers, which may be used in wireless communications systems.

BACKGROUND OF THE INVENTION

Direct current (DC) offsets often appear in electronic circuits that process electrical signals. When the DC offsets are large enough, they may interfere with proper processing of electrical signals. Additionally, changes in the DC offsets, such as changes that may occur over an operating temperature range or with power supply voltage variations, may be problematic. One method to reduce the impact of DC offsets is to interrupt processed electrical signals and then measure and compensate for DC offsets. However, in some circuits interruption of processed electrical signals may not be possible. For example, in a radio frequency (RF) communications terminal, an RF transmitter may continuously transmit an RF transmit signal, such as in a single-carrier frequency division multiple access (SC-FDMA) communications system or other fourth generation (4G) system, or as in a wideband code division multiple access (WCDMA) communications system or other third generation (3G) system. It may not be possible to interrupt such an RF transmit signal to make DC offset measurements of circuitry influenced by the RF transmit signal.

Furthermore, an RF communications terminal may use a DC power detector to measure the transmit power associated with a continuously transmitted RF signal. The DC power detector may have a DC offset that may affect measurements of the transmit power, particularly at low power levels. If the continuously transmitted RF signal may not be interrupted so that the DC offset can be measured, another way to determine the DC offset is needed. Similarly, the RF communications terminal may have an RF receiver, which may have a DC offset and may be influenced by the continuously transmitted RF signal. If the continuously transmitted RF signal may not be interrupted so that the DC offset of the RF receiver can be measured without the influence of the continuously transmitted RF signal, another way to determine the DC offset is needed.

SUMMARY OF THE EMBODIMENTS

Those skilled in the art will appreciate the scope of the present invention and realize additional aspects thereof after reading the following detailed description of the preferred embodiments in association with the accompanying drawing figures.

The present invention relates to estimating a direct current (DC) offset of a radio frequency (RF) receiver when an estimated amplitude of a continuous-transmission amplitude-modulated (AM) RF signal is below a first threshold and when the RF receiver is not receiving an RF input signal. The estimated DC offset of the RF receiver may be used to improve RF receiver performance, particularly over temperature and supply voltage variations. Estimating the DC offset of the RF receiver when the estimated instantaneous amplitude of the continuous-transmission AM RF signal is below the first threshold may minimize errors in the estimated DC offset.

In one embodiment of the present invention, a DC offset of a power detection circuit is estimated when the estimated instantaneous amplitude of the continuous-transmission AM RF signal is below a second threshold. The power detection circuit may be used to estimate an average output power associated with the continuous-transmission AM RF signal. The estimated average output power may be used as part of a feedback system to regulate the average output power. The estimated DC offset of the power detection circuit may be used to improve the estimate of the average output power, particularly over temperature and supply voltage variations. Estimating the DC offset of the power detection circuit when the estimated instantaneous amplitude of the continuous-transmission AM RF signal is below the second threshold may minimize errors in the estimated DC offset.

The continuous-transmission AM RF signal may be used in a single-carrier frequency division multiple access (SC-FDMA) communications system or other fourth generation (4G) system, or in a wideband code division multiple access (WCDMA) communications system or other third generation (3G) system. The continuous-transmission AM RF signal may be interrupted during slot boundaries between communications slots, such that a detector DC offset, a receiver DC offset, or both may be estimated during the interruption. In another embodiment of the present invention, both the DC offset of the RF receiver and the DC offset of the power detection circuit are estimated when the estimated instantaneous amplitude of the continuous-transmission AM RF signal is below the appropriate thresholds.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 4:
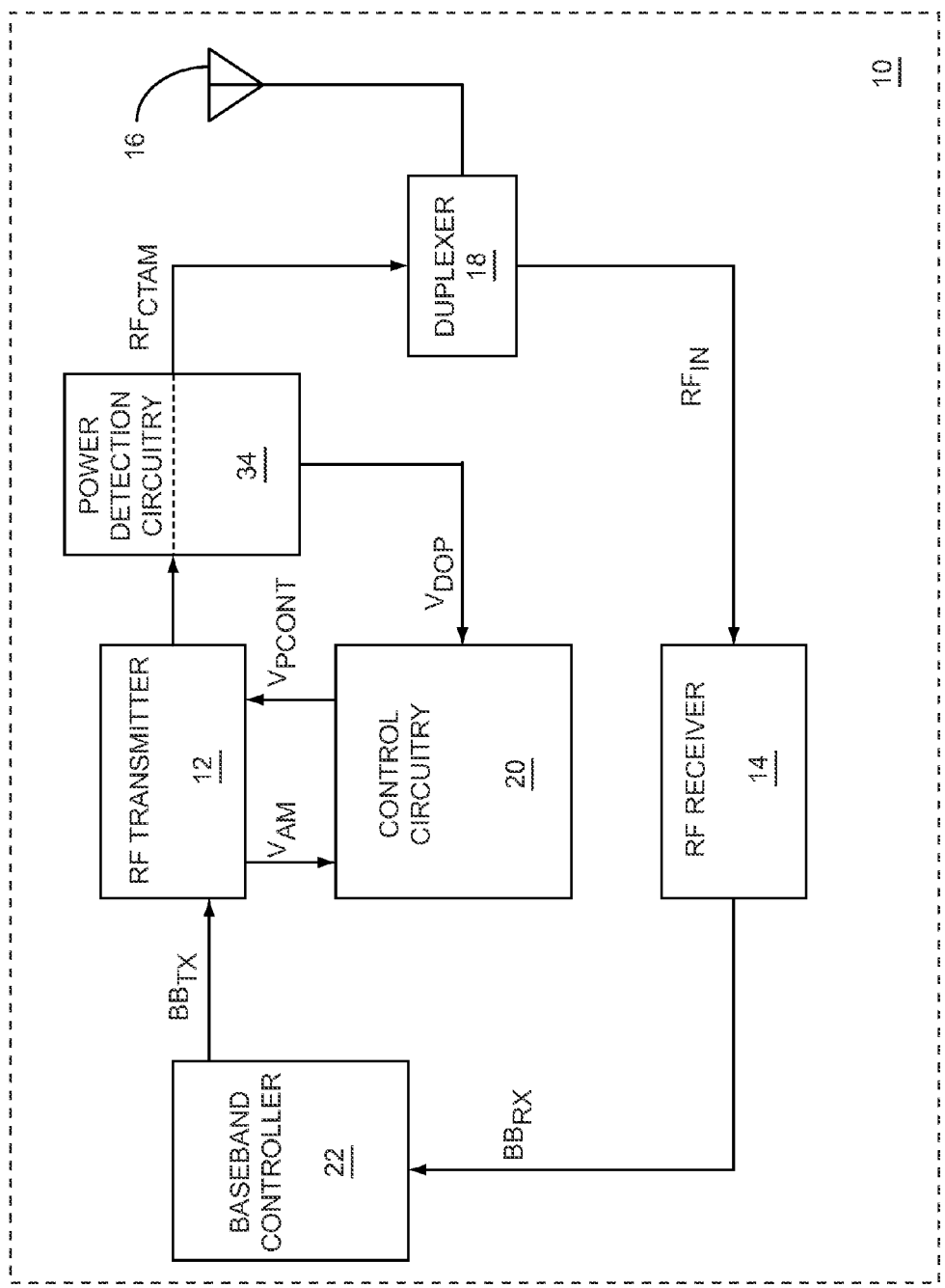
FIG. 4 shows the RF communications terminal applying a correction for a detector DC offset to a detected output power signal, according to a second embodiment of the present invention.

FIGS. 5A, 5B, and 5C are graphs illustrating the relationships between the amplitude modulation signal, the estimated amplitude signal, and a detected output power signal, respectively, of the RF communications terminal illustrated in FIG. 4.

FIGS. 6A and 6B are graphs illustrating the detected output power signal with a positive detector DC offset and with a negative detector DC offset, respectively, of the RF communications terminal illustrated in FIG. 4.

Figure 7:
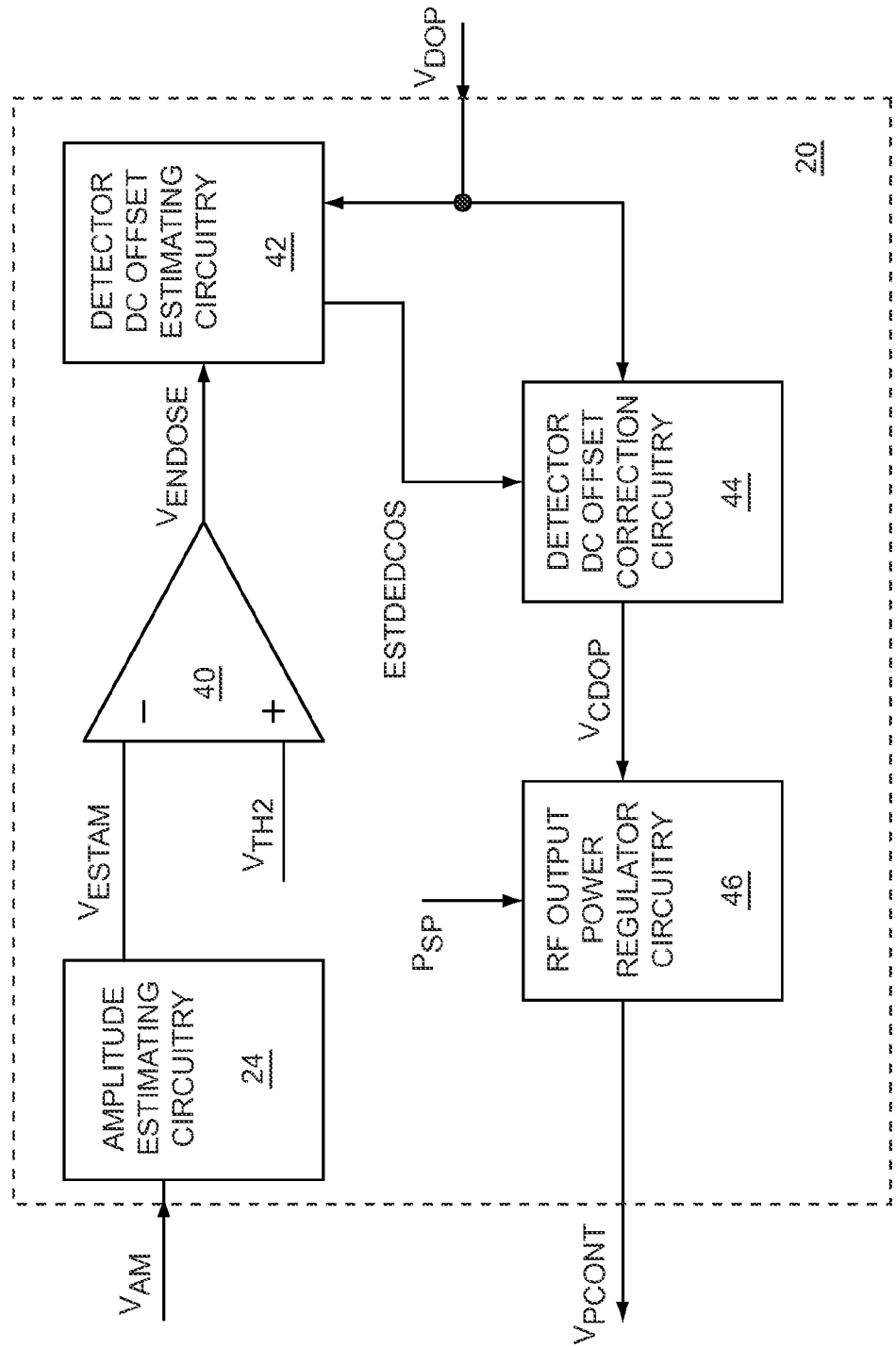

FIG. 7 shows details of the control circuitry illustrated in FIG. 4.

Figure 8:
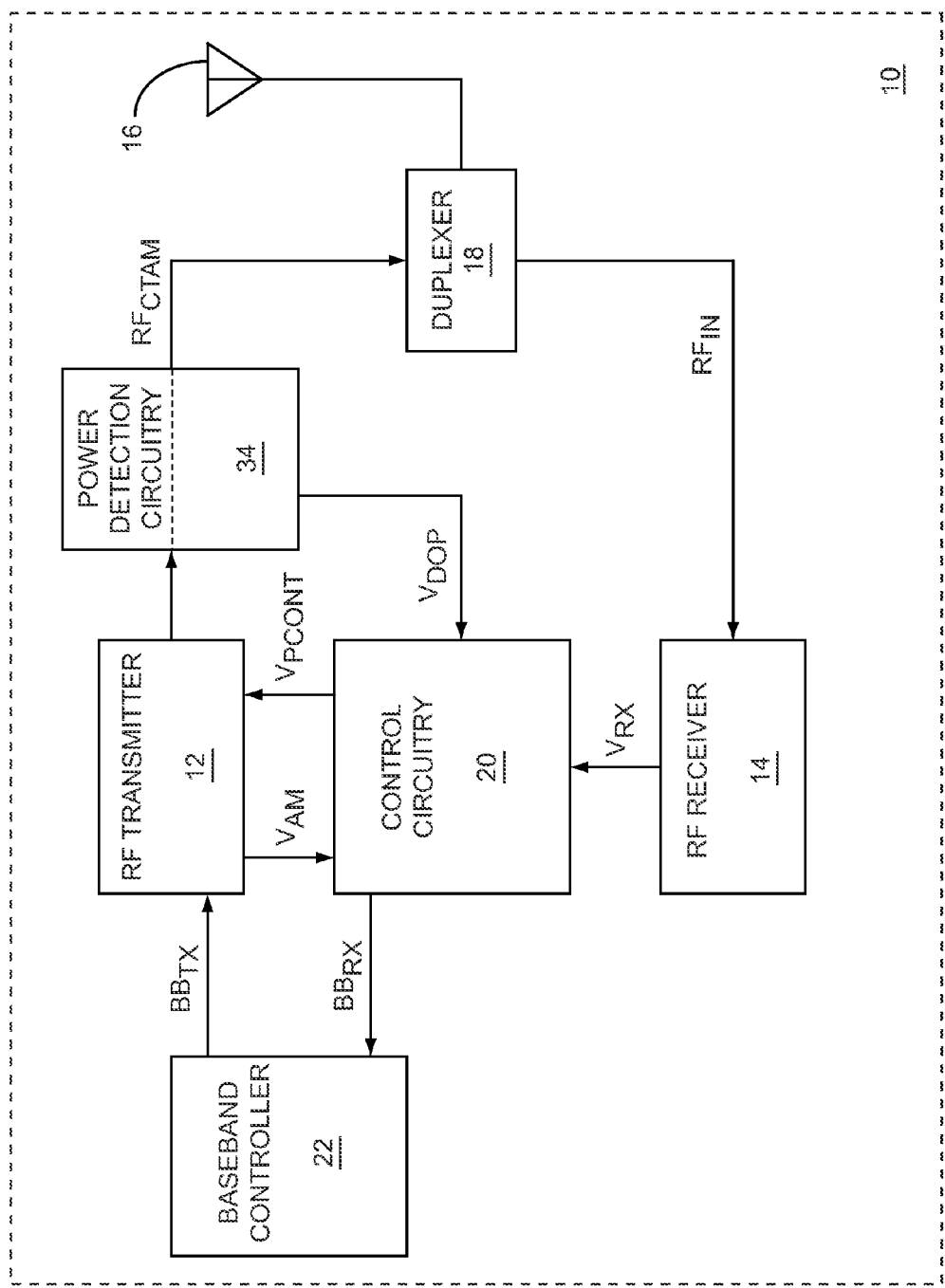

FIG. 8 shows the RF communications terminal applying a correction for a receiver DC offset to the RF input signal, and applying a correction for a detector DC offset to the detected output power signal, according to a third embodiment of the present invention.

Figure 9:
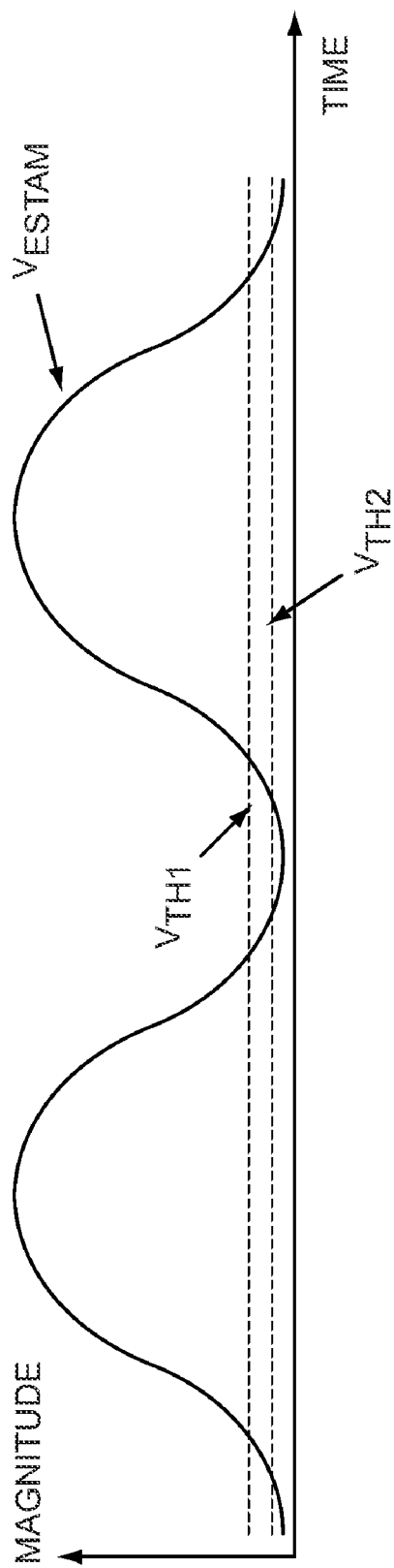

FIG. 9 is a graph illustrating the estimated amplitude signal, such that a first threshold and a second threshold are unequal, according to one embodiment of the RF communications terminal illustrated in FIG. 8.

Figure 10:
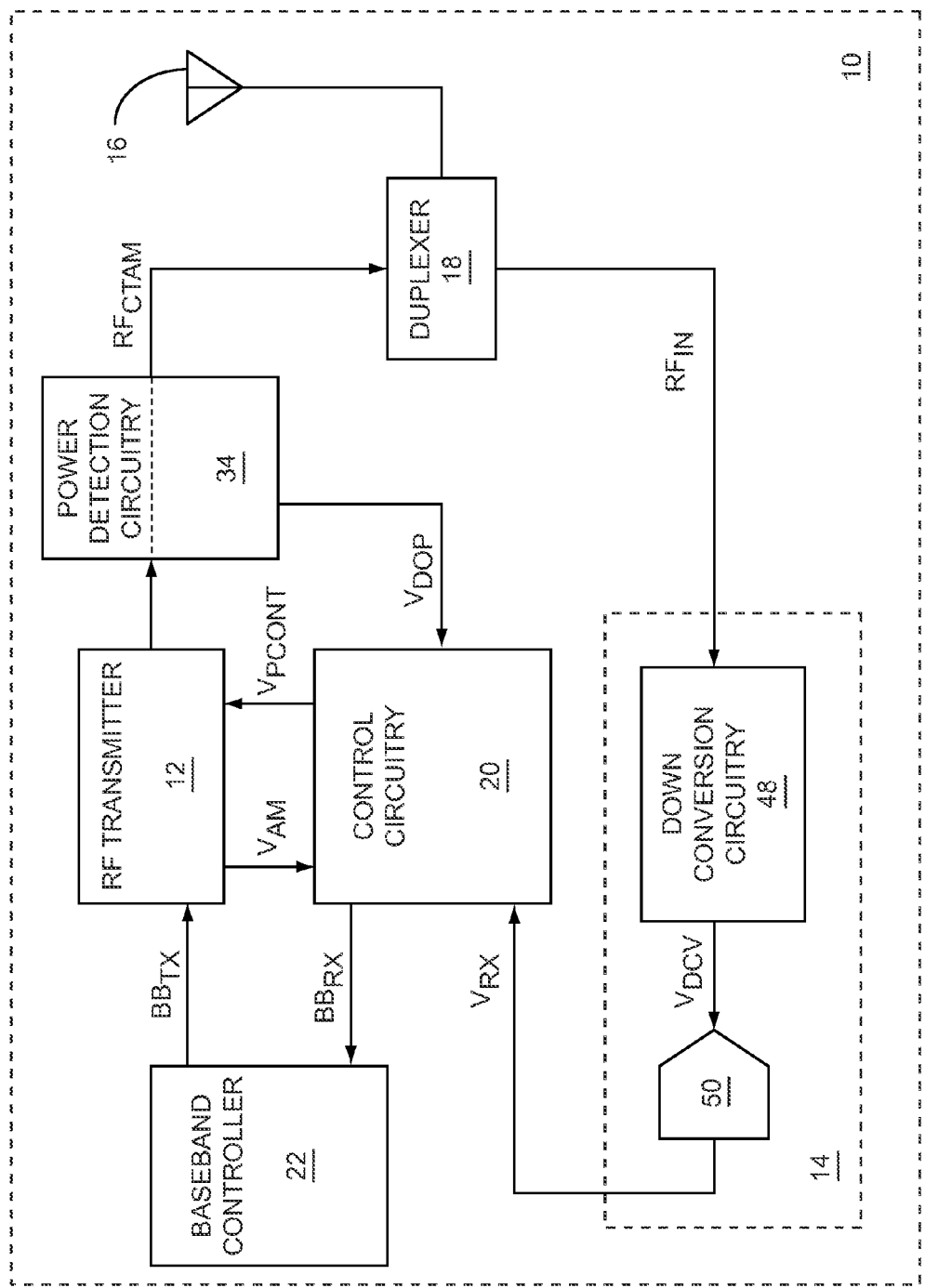

FIG. 10 shows details of an RF receiver illustrated in FIG. 8.

Figure 11:
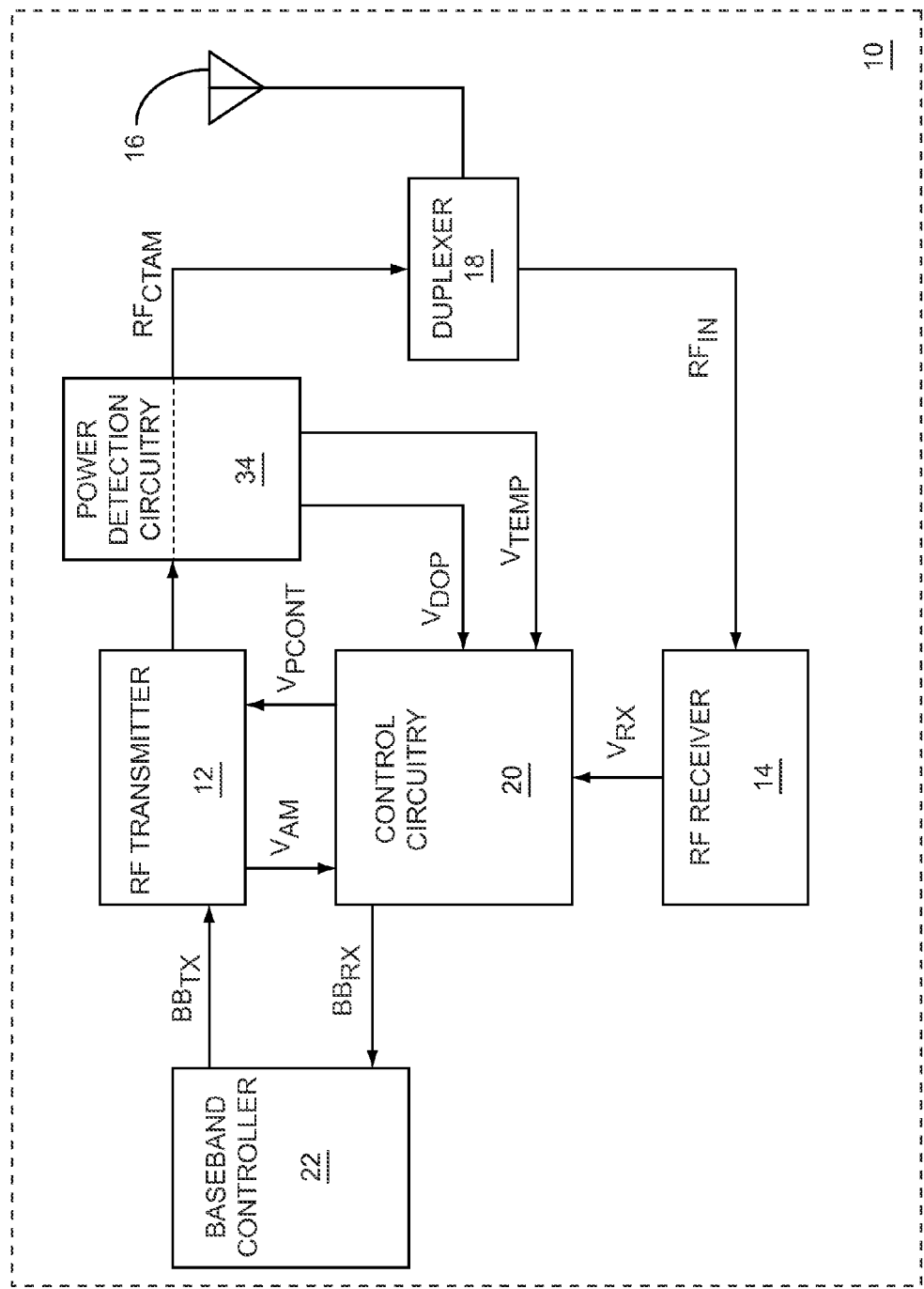

FIG. 11 shows power detection circuitry of the RF communications terminal illustrated in FIG. 8 providing a temperature signal, according to one embodiment of the present invention.

Figure 12:
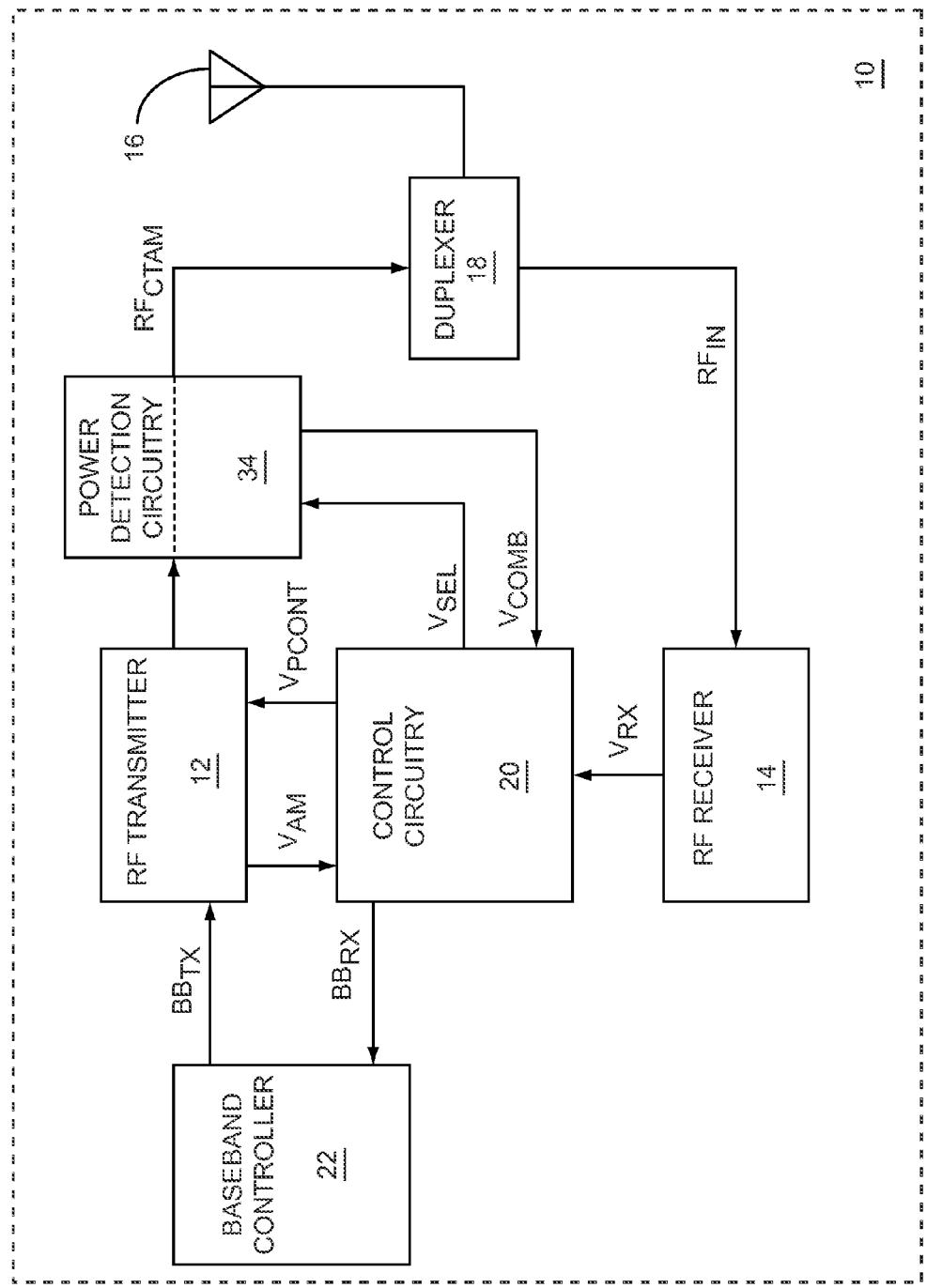

FIG. 12 shows the power detection circuitry of the RF communications terminal illustrated in FIG. 8 providing a combined signal, according to an alternate embodiment of the present invention.

Figure 13:
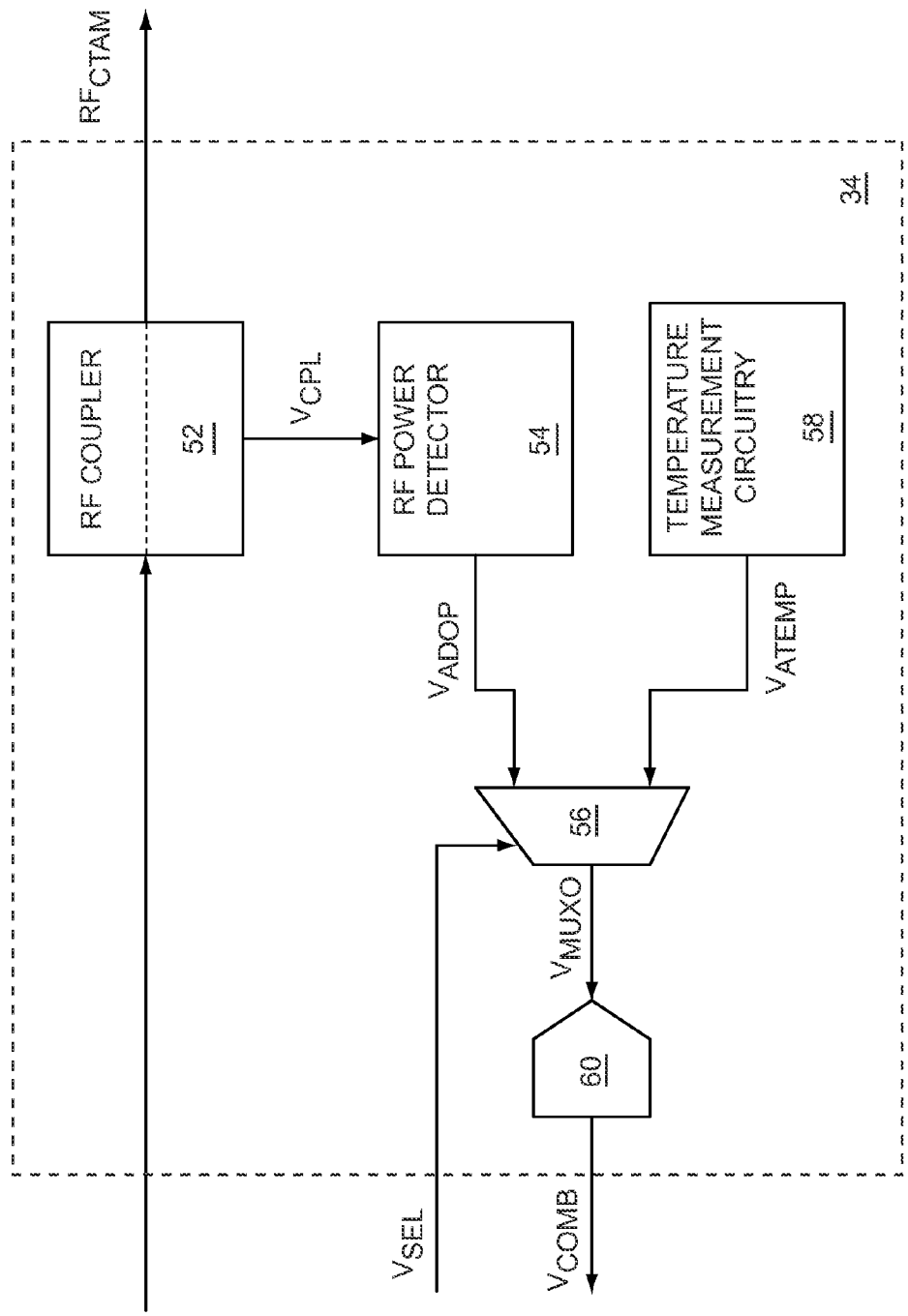

FIG. 13 shows details of the power detection circuitry illustrated in FIG. 12.

Figure 14A:
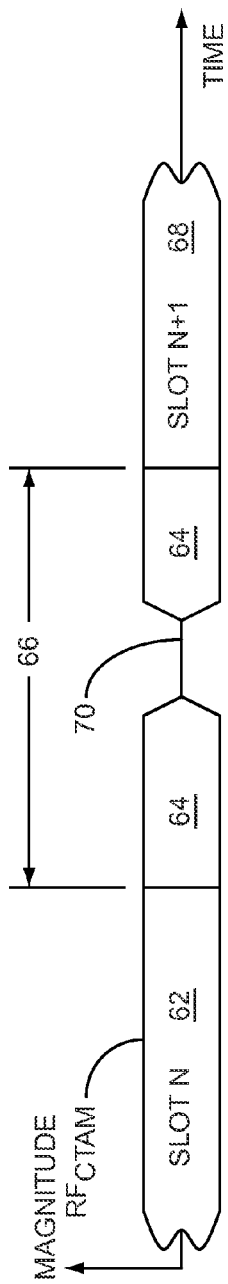
Figure 14B:
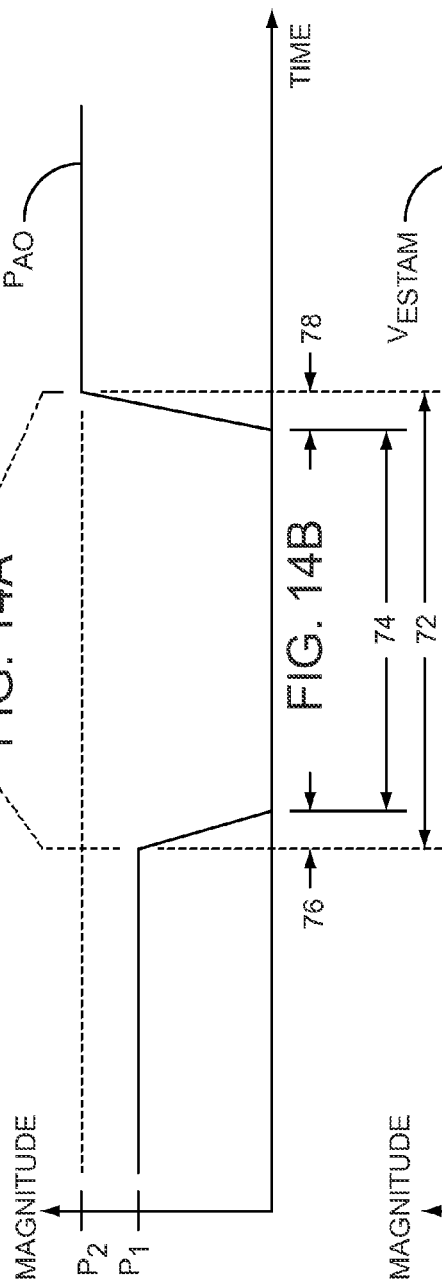
Figure 14C:
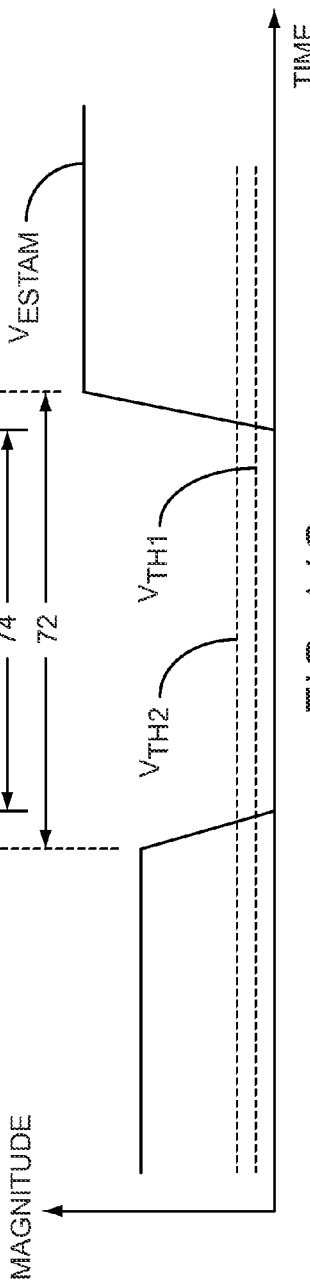

FIGS. 14A, 14B, and 14C illustrate the continuous-transmission AM RF signal, an average output power of the continuous-transmission AM RF signal, and the estimated amplitude signal of the RF communications terminal illustrated in FIG. 8, respectively, according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

In one embodiment of the present invention, a direct current (DC) offset of a radio frequency (RF) receiver is estimated when an estimated amplitude of a continuous-transmission amplitude-modulated (AM) RF signal is below a first threshold and when the RF receiver is not receiving an RF input signal. The estimated DC offset of the RF receiver may be used to improve RF receiver performance, particularly over temperature and supply voltage variations. Estimating the DC offset of the RF receiver when the estimated instantaneous amplitude of the continuous-transmission AM RF signal is below the first threshold may minimize errors in the estimated DC offset.

In an alternate embodiment of the present invention, a DC offset of a power detection circuit is estimated when the estimated instantaneous amplitude of the continuous-transmission AM RF signal is below a second threshold. The power detection circuit may be used to estimate an average output power associated with the continuous-transmission AM RF signal. The estimated average output power may be used as part of a feedback system to regulate the average output power. The estimated DC offset of the power detection circuit may be used to improve the estimate of the average output power, particularly over temperature and supply voltage variations. Estimating the DC offset of the power detection circuit when the estimated instantaneous amplitude of the continuous-transmission AM RF signal is below the second threshold may minimize errors in the estimated DC offset.

The continuous-transmission AM RF signal may be used in a single-carrier frequency division multiple access (SC-FDMA) communications system or other fourth generation (4G) system, or in a wideband code division multiple access (WCDMA) communications system or other third generation (3G) system. The continuous-transmission AM RF signal may be interrupted during slot boundaries between communications slots, such that a detector DC offset, a receiver DC offset, or both may be estimated during the interruption. In another embodiment of the present invention, both the DC offset of the RF receiver and the DC offset of the power detection circuit are estimated when the estimated instantaneous amplitude of the continuous-transmission AM RF signal is below the appropriate thresholds.

Figure 1:
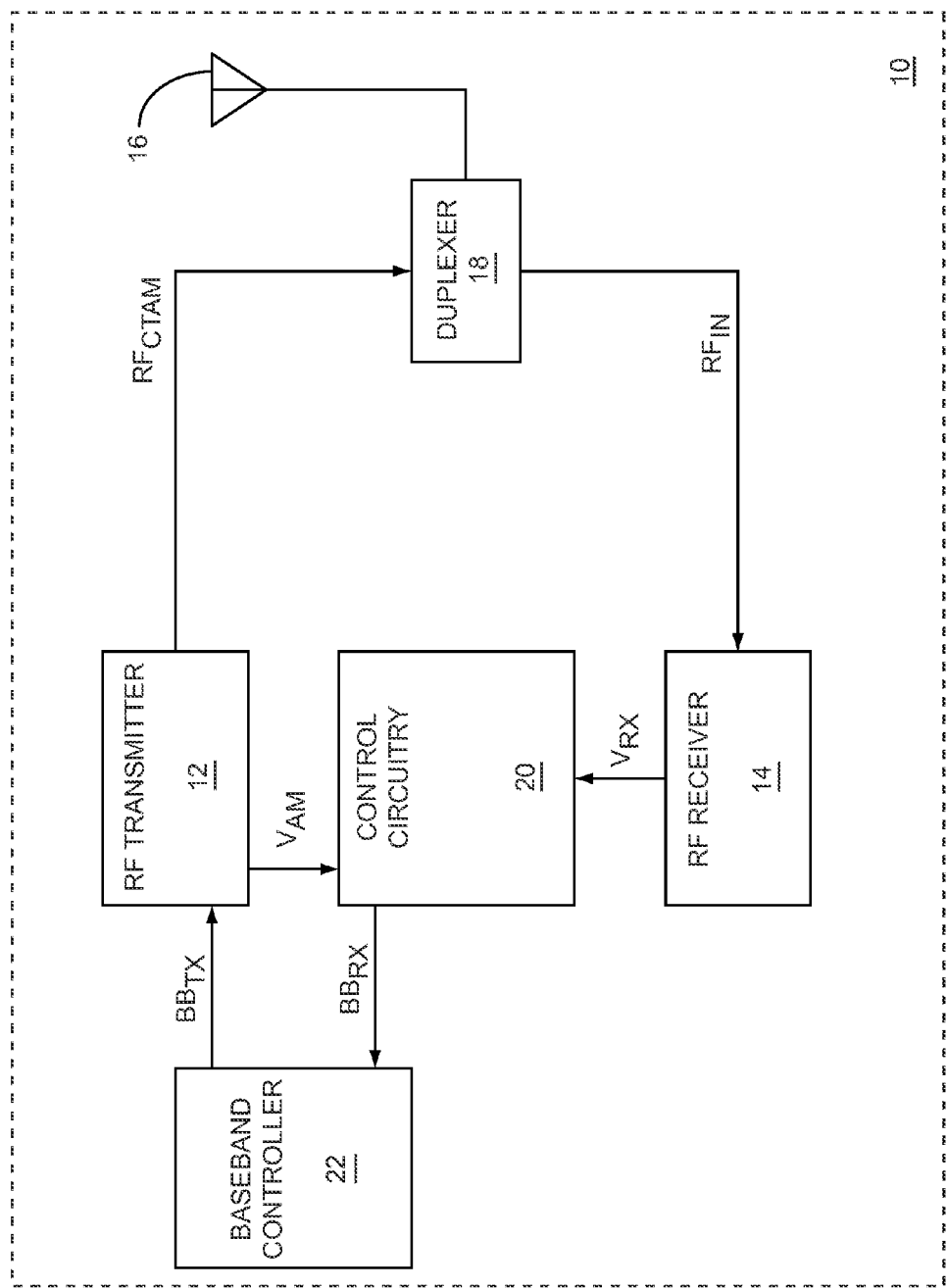
FIG. 1 shows a radio frequency (RF) communications terminal applying a correction for a receiver direct current (DC) offset to an RF input signal, according to a first embodiment of the present invention.

FIG. 1 shows an RF communications terminal 10 applying a correction for a receiver DC offset to an RF input signal $RF_{IN}$, according to a first embodiment of the present invention. An RF transmitter 12 and an RF receiver 14 are coupled to an antenna 16 through a duplexer 18. The RF transmitter 12 feeds a continuous-transmission AM RF signal $RF_{CTAM}$ through the duplexer 18 to the antenna 16, which transmits the continuous-transmission AM RF signal $RF_{CTAM}$. The antenna 16 receives and provides an RF input signal $RF_{IN}$ to the RF receiver 14 through the duplexer 18. The RF receiver 14 may down convert the RF input signal $RF_{IN}$ into a received signal $V_{RX}$, which is fed to control circuitry 20. The control circuitry 20 may further down convert, process, or both, the received signal $V_{RX}$ into a received baseband signal $BB_{RX}$, which is fed to a baseband controller 22. A transmit baseband signal $BB_{TX}$ is fed from the baseband controller 22 to the RF transmitter 12, which uses the transmit baseband signal $BB_{TX}$ to modulate an RF carrier to provide the continuous-transmission AM RF signal $RF_{CTAM}$.

The RF receiver 14 may have a receiver DC offset, which may introduce an offset in the received signal $V_{RX}$ when receiving the RF input signal $RF_{IN}$; however, the DC offset may be estimated by measuring the received signal $V_{RX}$ when the RF receiver 14 is not receiving the RF input signal $RF_{IN}$. Subsequently, the control circuitry 20 may subtract the estimated DC offset from the received signal $V_{RX}$ to improve receiver performance. The receiver DC offset may be sensitive to temperature variations, supply voltage variations, or both. Therefore, the receiver DC offset may need to be estimated frequently.

The continuous-transmission AM RF signal $RF_{CTAM}$ may be a continuously transmitted AM signal. In one embodiment of the present invention, the continuous-transmission AM RF signal $RF_{CTAM}$ is a polar-modulated RF signal, which may be a WCDMA transmit RF signal or other 3G transmit signal. In another embodiment of the present invention, the continuous-transmission AM RF signal $RF_{CTAM}$ is a polar-modulated RF signal, which may be an SC-FDMA transmit RF signal or other 4G transmit signal. The continuous-transmission AM RF signal $RF_{CTAM}$ and the RF input signal $RF_{IN}$ may be associated with a full-duplex communications protocol, such that the RF transmitter 12 and the RF receiver 14 transmit and receive simultaneously. Therefore, to prevent interference with each other, the continuous-transmission AM RF signal $RF_{CTAM}$ and the RF input signal $RF_{IN}$ may have different RF carrier frequencies. The duplexer 18 has a receive passband, which passes the RF input signal $RF_{IN}$ from the antenna 16 to the RF receiver 14. Likewise, the duplexer 18 has a transmit passband, which passes the continuous-transmission AM RF signal $RF_{CTAM}$ from the RF transmitter 12 to the antenna 16.

Ideally, the duplexer 18 completely isolates the RF receiver 14 from the continuous-transmission AM RF signal $RF_{CTAM}$; however, in practice, some of the continuous-transmission AM RF signal $RF_{CTAM}$ may be coupled to the RF receiver 14 through the duplexer 18, through other circuit paths, or both. The continuous-transmission AM RF signal $RF_{CTAM}$ may interfere with estimates of the receiver DC offset and, since the continuous-transmission AM RF signal $RF_{CTAM}$ is continuously present, it may be desirable to estimate the receiver DC offset only when the instantaneous amplitude of the continuous-transmission AM RF signal $RF_{CTAM}$ is below a first threshold $V_{TH1}$. However, the instantaneous amplitude of the continuous-transmission AM RF signal $RF_{CTAM}$ may not be known directly. Therefore, in one embodiment of the present invention, estimates of the receiver DC offset are performed only when an estimated instantaneous amplitude of the continuous-transmission AM RF signal $RF_{CTAM}$ is below the first threshold $V_{TH1}$. The control circuitry 20 uses the estimates of the receiver DC offset to correct the received signal $V_{RX}$.

Figure 2A:
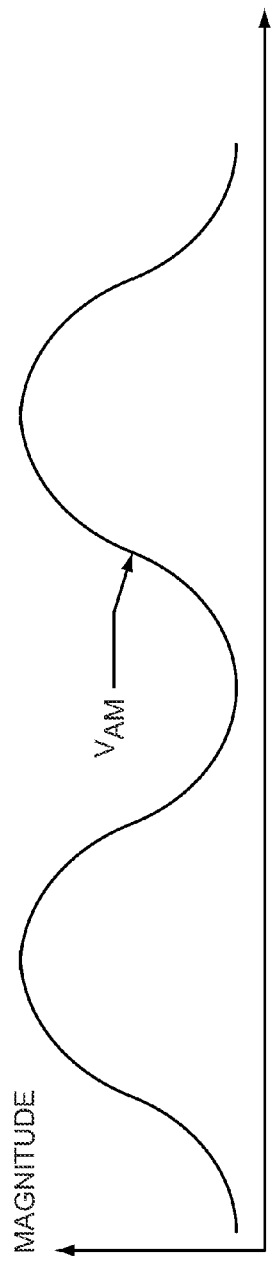
FIGS. 2A and 2B are graphs illustrating the relationships between an amplitude modulation signal, a continuous-transmission amplitude-modulated (AM) RF signal, and an estimated amplitude signal of the RF communications terminal illustrated in FIG. 1.
Figure 2B:
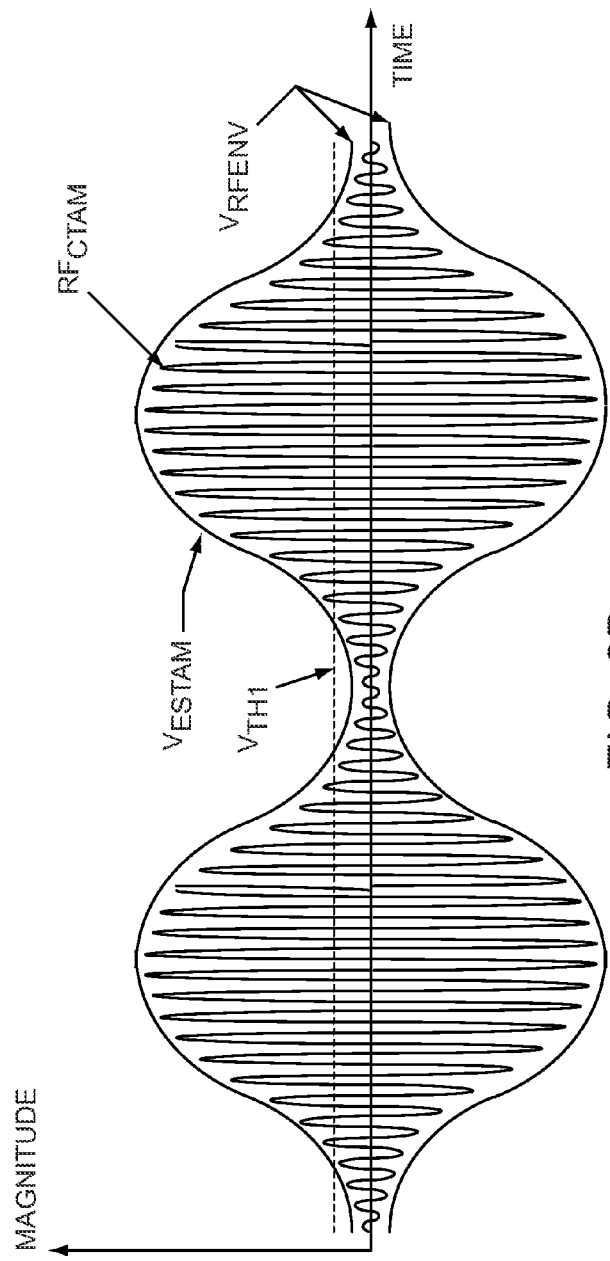

The RF transmitter 12 may use an amplitude modulation signal $V_{AM}$ to amplitude modulate an RF carrier to provide the continuous-transmission AM RF signal $RF_{CTAM}$. The amplitude modulation signal $V_{AM}$ is fed to the control circuitry 20 and may be used to estimate the instantaneous amplitude of the continuous-transmission AM RF signal $RF_{CTAM}$. FIGS. 2A and 2B are graphs illustrating the relationships between the amplitude modulation signal $V_{AM}$, the continuous-transmission AM RF signal $RF_{CTAM}$, and an estimated amplitude signal $V_{ESTAM}$ of the RF communications terminal 10 illustrated in FIG. 1. Since the amplitude modulation signal $V_{AM}$ is used to amplitude modulate an RF carrier to provide the continuous-transmission AM RF signal $RF_{CTAM}$, an RF envelope $V_{RFENV}$ tracks the amplitude of the continuous-transmission AM RF signal $RF_{CTAM}$. The positive side of the RF envelope $V_{RFENV}$ defines an ideal estimated amplitude signal $V_{ESTAM}$. When the estimated amplitude signal $V_{ESTAM}$ is less than the first threshold $V_{TH1}$ and the RF receiver 14 is not receiving the RF input signal $RF_{IN}$, the control circuitry 20 may estimate the receiver DC offset.

In one embodiment of the present invention, the estimated amplitude signal $V_{ESTAM}$ is continuously less than the first threshold $V_{TH1}$; therefore, the control circuitry 20 may continuously estimate the receiver DC offset. In another embodiment of the present invention, the control circuitry 20 may estimate the receiver DC offset when the continuous-transmission AM RF signal $RF_{CTAM}$ is disabled, such as before the continuous-transmission AM RF signal $RF_{CTAM}$ is enabled, during slot boundaries between communications slots, or both. When the RF receiver 14 is not receiving the RF input signal $RF_{IN}$, the RF receiver 14 may receive other RF signals, such as noise or interfering signals. To minimize the influence of the other RF signals on the estimate of the receiver DC offset, the control circuitry 20 may estimate the receiver DC offset based on an average of the received signal $V_{RX}$.

Figure 3:
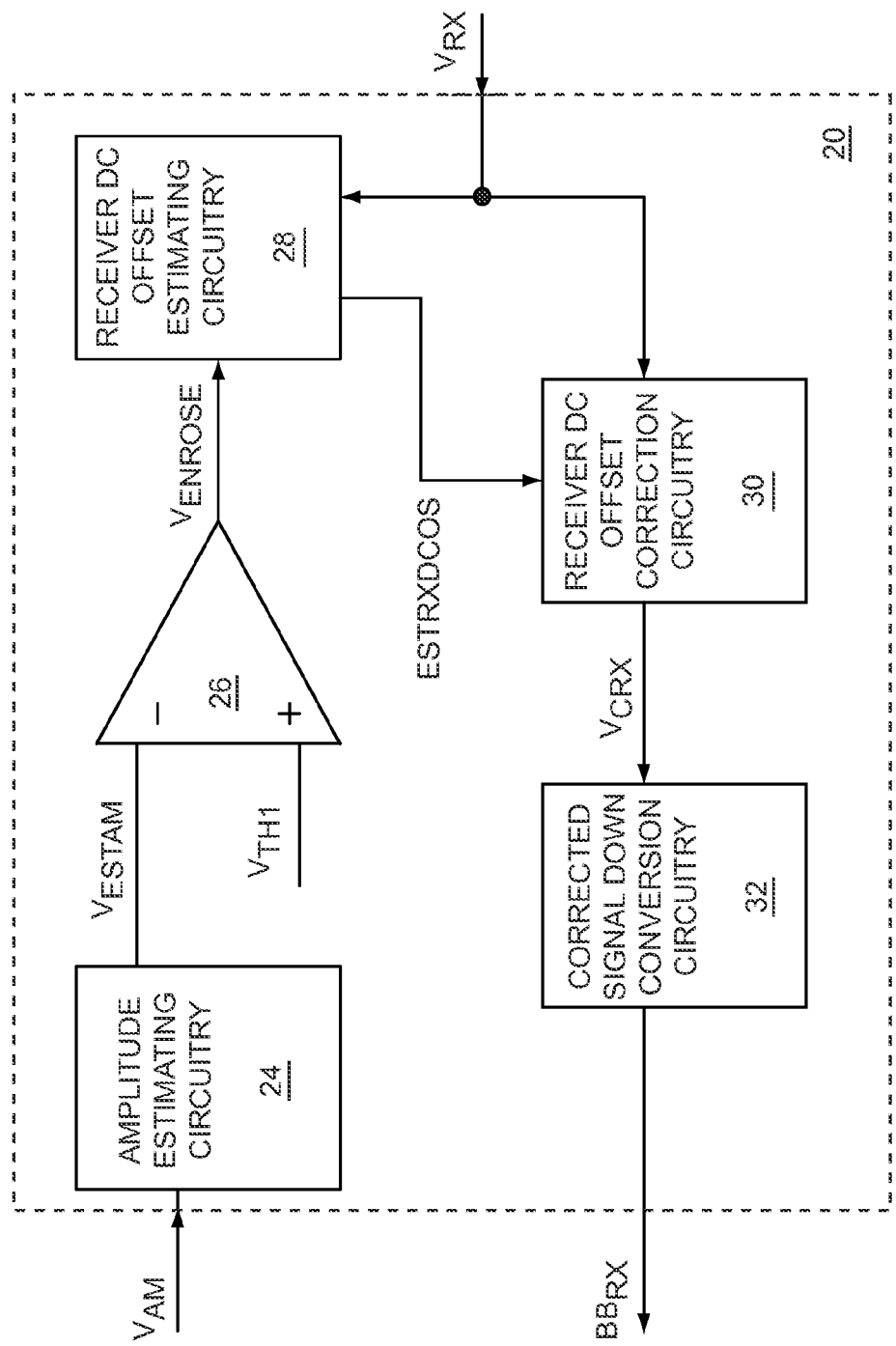
FIG. 3 shows details of control circuitry illustrated in FIG. 1.

FIG. 3 shows details of the control circuitry 20 illustrated in FIG. 1, according to one embodiment of the present invention. The amplitude modulation signal $V_{AM}$ is fed to amplitude estimating circuitry 24, which estimates the instantaneous amplitude of the continuous-transmission AM RF signal $RF_{CTAM}$ to provide the estimated amplitude signal $V_{ESTAM}$. A first comparator 26 receives and compares the estimated amplitude signal $V_{ESTAM}$ and the first threshold $V_{TH1}$. The first comparator 26 provides a receiver offset estimating enable signal $V_{ENROSE}$ to receiver DC offset estimating circuitry 28 based on the comparison of the estimated amplitude signal $V_{ESTAM}$ and the first threshold $V_{TH1}$.

When the estimated amplitude signal $V_{ESTAM}$ is less than the first threshold $V_{TH1}$, the receiver offset estimating enable signal $V_{ENROSE}$ is in an enabled state, which enables estimating of the receiver DC offset by the receiver DC offset estimating circuitry 28. When the estimated amplitude signal $V_{ESTAM}$ is greater than the first threshold $V_{TH1}$, the receiver offset estimating enable signal $V_{ENROSE}$ is in a disabled state, which disables estimating of the receiver DC offset by the receiver DC offset estimating circuitry 28. The receiver DC offset estimating circuitry 28 receives the received signal $V_{RX}$ and estimates the receiver DC offset when the RF receiver 14 is not receiving the RF input signal $RF_{IN}$ and the receiver offset estimating enable signal $V_{ENROSE}$ is in the enabled state based on the received signal $V_{RX}$.

The receiver DC offset estimating circuitry 28 provides an estimated DC offset ESTRXDCOS to receiver DC offset correction circuitry 30, which receives and applies a DC offset correction to the received signal $V_{RX}$ to provide a corrected received signal $V_{CRX}$ to corrected signal down conversion circuitry 32. The receiver DC offset correction circuitry 30 may apply the DC offset correction by subtracting the estimated DC offset ESTRXDCOS from the received signal $V_{RX}$. The corrected signal down conversion circuitry 32 further down converts the corrected received signal $V_{CRX}$ to provide the received baseband signal $BB_{RX}$. In an alternate embodiment of the present invention, the corrected signal down conversion circuitry 32 is omitted and the corrected received signal $V_{CRX}$ directly provides the received baseband signal $BB_{RX}$.

FIG. 4 shows the RF communications terminal 10 applying a correction for a detector DC offset to a detected output power signal $V_{DOP}$, according to a second embodiment of the present invention. The RF transmitter 12 and the RF receiver 14 are coupled to the antenna 16 through the duplexer 18. The RF transmitter 12 feeds the continuous-transmission AM RF signal $RF_{CTAM}$ through the duplexer 18 to the antenna 16, which transmits the continuous-transmission AM RF signal $RF_{CTAM}$. Power detection circuitry 34 is coupled between the RF transmitter 12 and the duplexer 18, and detects the transmitted power associated with the continuous-transmission AM RF signal $RF_{CTAM}$. The antenna 16 receives and provides an RF input signal $RF_{IN}$ to the RF receiver 14 through the duplexer 18. The RF receiver 14 may down convert the RF input signal $RF_{IN}$ into the received baseband signal $BB_{RX}$, which is fed to the baseband controller 22. The transmit baseband signal $BB_{TX}$ is fed from the baseband controller 22 to the RF transmitter 12, which uses the transmit baseband signal $BB_{TX}$ to modulate an RF carrier to provide the continuous-transmission AM RF signal $RF_{CTAM}$.

The power detection circuitry 34 provides the detected output power signal $V_{DOP}$ to the control circuitry 20 based on the detected transmitted power associated with the continuous-transmission AM RF signal $RF_{CTAM}$. The control circuitry 20 may estimate an average output power associated with the continuous-transmission AM RF signal $RF_{CTAM}$ based on the detected output power signal $V_{DOP}$. Additionally, the control circuitry 20 may regulate the average output power associated with the continuous-transmission AM RF signal $RF_{CTAM}$ based on the estimated average output power and a setpoint, such that the average output power is about equal to the setpoint. The control circuitry 20 may regulate the average output power by providing a power control signal $V_{PCONT}$ to the RF transmitter 12, which controls the amplitude of the continuous-transmission AM RF signal $RF_{CTAM}$ based on the power control signal $V_{PCONT}$. The setpoint may be based on a received command provided by the RF input signal $RF_{IN}$.

The continuous-transmission AM RF signal $RF_{CTAM}$ may be a continuously transmitted AM signal. In one embodiment of the present invention, the continuous-transmission AM RF signal $RF_{CTAM}$ is a polar-modulated RF signal, which may be a WCDMA transmit RF signal or other 3G transmit signal. In another embodiment of the present invention, the continuous-transmission AM RF signal $RF_{CTAM}$ is a polar-modulated RF signal, which may be an SC-FDMA transmit RF signal or other 4G transmit signal. The continuous-transmission AM RF signal $RF_{CTAM}$ and the RF input signal $RF_{IN}$ may be associated with a full-duplex communications protocol, such that the RF transmitter 12 and the RF receiver 14 transmit and receive simultaneously. Therefore, to prevent interference with each other, the continuous-transmission AM RF signal $RF_{CTAM}$ and the RF input signal $RF_{IN}$ may have different RF carrier frequencies. The duplexer 18 has a receive passband, which passes the RF input signal $RF_{IN}$ from the antenna 16 to the RF receiver 14. Likewise, the duplexer 18 has a transmit passband, which passes the continuous-transmission AM RF signal $RF_{CTAM}$ from the RF transmitter 12 to the antenna 16.

The power detection circuitry 34 may have a detector DC offset, which may introduce an offset in the detected output power signal $V_{DOP}$. The detector DC offset may be estimated by measuring the detected output power signal $V_{DOP}$ when the continuous-transmission AM RF signal $RF_{CTAM}$ is disabled. Subsequently, the control circuitry 20 may subtract the estimated DC offset from the detected output power signal $V_{DOP}$ to improve accuracy of the estimated average output power. The detector DC offset may be sensitive to temperature variations, supply voltage variations, or both. Therefore, the detector DC offset may need to be estimated frequently. Since the continuous-transmission AM RF signal $RF_{CTAM}$ is continuously present, it may not be possible to disable the continuous-transmission AM RF signal $RF_{CTAM}$ to estimate the detector DC offset. Therefore, according to one embodiment of the present invention, it may be desirable to estimate the detector DC offset only when the instantaneous amplitude of the continuous-transmission AM RF signal $RF_{CTAM}$ is below a second threshold $V_{TH2}$.

The instantaneous amplitude of the continuous-transmission AM RF signal $RF_{CTAM}$ may not be known directly. Therefore, in one embodiment of the present invention, estimates of the detector DC offset are performed only when an estimated instantaneous amplitude of the continuous-transmission AM RF signal $RF_{CTAM}$ is below the second threshold $V_{TH2}$. The control circuitry 20 uses the estimates of the detector DC offset to correct the detected output power signal $V_{DOP}$. The RF transmitter 12 may use the amplitude modulation signal $V_{AM}$ to amplitude modulate an RF carrier to provide the continuous-transmission AM RF signal $RF_{CTAM}$. The amplitude modulation signal $V_{AM}$ is fed to the control circuitry 20 and may be used to estimate the instantaneous amplitude of the continuous-transmission AM RF signal $RF_{CTAM}$. When the estimated amplitude signal $V_{ESTAM}$ is less than the second threshold $V_{TH2}$, the control circuitry 20 may estimate the detector DC offset.

In one embodiment of the present invention, the control circuitry 20 may estimate the receiver DC offset when the continuous-transmission AM RF signal $RF_{CTAM}$ is disabled, such as before the continuous-transmission AM RF signal $RF_{CTAM}$ is enabled, during slot boundaries between communications slots, or both. To minimize the influence of noise or other signals on the estimate of the detector DC offset, the control circuitry 20 may estimate the detector DC offset based on an average of the detected output power signal $V_{DOP}$. The detector DC offset may be very sensitive to temperature changes. In an exemplary embodiment of the present invention, the detector DC offset may change between 20 millivolts and 60 millivolts over an operating temperature range of the RF communications terminal 10. System requirements may restrict the maximum change of the detector DC offset to be less than one millivolt over the operating temperature range of the RF communications terminal 10.

In one embodiment of the present invention, the RF communications terminal 10 includes temperature measurement and correction circuitry, which measures the temperature of the power detection circuitry 34 and provides a temperature signal based on the measured temperature. The temperature measurement and correction circuitry temperature corrects the detected output power signal $V_{DOP}$ based on the temperature signal. Even with temperature correction, the detector DC offset temperature drift in the detected output power signal $V_{DOP}$ may require further detector DC offset correction. In one embodiment of the present invention, the estimated detector DC offset tracks the actual detector DC offset within one percent over the operating temperature range of the RF communications terminal 10.

FIGS. 5A, 5B, and 5C are graphs illustrating the relationships between the amplitude modulation signal $V_{AM}$, the estimated amplitude signal $V_{ESTAM}$, and the detected output power signal $V_{DOP}$, respectively, of the RF communications terminal 10 illustrated in FIG. 4. Since the amplitude modulation signal $V_{AM}$ is used to amplitude modulate an RF carrier to provide the continuous-transmission AM RF signal $RF_{CTAM}$, the amplitude modulation signal $V_{AM}$ may be used to estimate the instantaneous amplitude of the continuous-transmission AM RF signal $RF_{CTAM}$, and may produce the estimated amplitude signal $V_{ESTAM}$. When the estimated amplitude signal $V_{ESTAM}$ is less than the second threshold $V_{TH2}$, the detected output power signal $V_{DOP}$ is at a minimum; therefore, the control circuitry 20 may estimate the detector DC offset based on the detected output power signal $V_{DOP}$.

The estimated amplitude signal $V_{ESTAM}$ is less than the second threshold $V_{TH2}$ during an offset estimation period 36. During the offset estimation period 36, the detected output power signal $V_{DOP}$ may include effects of the detector DC offset and the detected power of the continuous-transmission AM RF signal $RF_{CTAM}$. Since the control circuitry 20 may estimate the detector DC offset during the offset estimation period 36, the detected power of the continuous-transmission AM RF signal $RF_{CTAM}$ represents an error in the estimation of the detector DC offset. Therefore, according to one embodiment of the present invention, during the offset estimation period 36, the control circuitry 20 can estimate the instantaneous detected power of the continuous-transmission AM RF signal $RF_{CTAM}$ based on the estimated instantaneous amplitude of the continuous-transmission AM RF signal $RF_{CTAM}$ and subtract the estimated instantaneous detected power from the estimation of the detector DC offset. Thus, the estimated detector DC offset is based on the detected output power signal $V_{DOP}$ and the estimated instantaneous amplitude of the continuous-transmission AM RF signal $RF_{CTAM}$ during the offset estimation period 36.

According to an alternative embodiment of the present invention, during the offset estimation period 36, the control circuitry 20 can estimate the average detected power of the continuous-transmission AM RF signal $RF_{CTAM}$ based on an average estimated instantaneous amplitude of the continuous-transmission AM RF signal $RF_{CTAM}$ during the offset estimation period 36 and subtract the estimated average detected power from the estimation of the detector DC offset. Thus, the estimated detector DC offset is based on the detected output power signal $V_{DOP}$ and the average estimated instantaneous amplitude of the continuous-transmission AM RF signal $RF_{CTAM}$ during the offset estimation period 36. In an additional embodiment of the present invention, the estimated instantaneous amplitude of the continuous-transmission AM RF signal $RF_{CTAM}$ may be based on the detected output power signal $V_{DOP}$ instead of the amplitude modulation signal $V_{AM}$.

There may be a delay 37 between the amplitude modulation signal $V_{AM}$ and the detected output power signal $V_{DOP}$. Therefore, in one embodiment of the present invention, the estimated instantaneous amplitude of the continuous-transmission AM RF signal $RF_{CTAM}$ may be based on the amplitude modulation signal $V_{AM}$ and an estimate of the delay 37 to improve accuracy in the estimation of the detector DC offset. The power detection circuitry 34 may have a wide operating power range; however, estimation and error correction of the detector DC offset may be more important at low average output power levels, such as between +5 decibel milliwatt (dbm) and −5 dbm. Therefore, in one embodiment of the present invention, the second threshold $V_{TH2}$ is based on the estimated average output power.

FIGS. 6A and 6B are graphs illustrating the detected output power signal $V_{DOP}$ with a positive detector DC offset $V_{PDCO}$ and with a negative detector DC offset $V_{NDCO}$, respectively, of the RF communications terminal 10 illustrated in FIG. 4. A difference 38 between the detected output power signal $V_{DOP}$ and the positive detector DC offset $V_{PDCO}$ or the negative detector DC offset $V_{NDCO}$ is indicative of the true detected power of the continuous-transmission AM RF signal $RF_{CTAM}$.

FIG. 7 shows details of the control circuitry 20 illustrated in FIG. 4. The amplitude modulation signal $V_{AM}$ is fed to the amplitude estimating circuitry 24, which estimates the instantaneous amplitude of the continuous-transmission AM RF signal $RF_{CTAM}$ to provide the estimated amplitude signal $V_{ESTAM}$. A second comparator 40 receives and compares the estimated amplitude signal $V_{ESTAM}$ and the second threshold $V_{TH2}$. The second comparator 40 provides a detector offset estimating enable signal $V_{ENDOSE}$ to detector DC offset estimating circuitry 42 based on the comparison of the estimated amplitude signal $V_{ESTAM}$ and the second threshold $V_{TH2}$.

When the estimated amplitude signal $V_{ESTAM}$ is less than the second threshold $V_{TH2}$, the detector offset estimating enable signal $V_{ENDOSE}$ is in an enabled state, which enables estimating of the detector DC offset by the detector DC offset estimating circuitry 42. When the estimated amplitude signal $V_{ESTAM}$ is greater than the second threshold $V_{TH2}$, the detector offset estimating enable signal $V_{ENDOSE}$ is in a disabled state, which disables estimating of the detector DC offset by the detector DC offset estimating circuitry 42. The detector DC offset estimating circuitry 42 receives the detected output power signal $V_{DOP}$ and estimates the detector DC offset when the detector offset estimating enable signal $V_{ENDOSE}$ is in the enabled state based on the detected output power signal $V_{DOP}$.

The detector DC offset estimating circuitry 42 provides an estimated DC offset ESTDETDCOS to detector DC offset correction circuitry 44, which receives and applies a DC offset correction to the detected output power signal $V_{DOP}$ to provide a corrected detected output power signal $V_{CDOP}$ to RF output power regulator circuitry 46. The detector DC offset correction circuitry 44 may apply the DC offset correction by subtracting the estimated DC offset ESTDETDCOS from the detected output power signal $V_{DOP}$. The RF output power regulator circuitry 46 may estimate the average output power associated with the continuous-transmission AM RF signal $RF_{CTAM}$ based on the corrected detected output power signal $V_{CDOP}$. Additionally, the RF output power regulator circuitry 46 may regulate the average output power associated with the continuous-transmission AM RF signal $RF_{CTAM}$ based on the estimated average output power and a power setpoint $P_{SP}$, such that the average output power is about equal to the power setpoint $P_{SP}$. The RF output power regulator circuitry 46 may regulate the average output power by providing the power control signal $V_{PCONT}$ to the RF transmitter 12, which controls the amplitude of the continuous-transmission AM RF signal $RF_{CTAM}$ based on the power control signal $V_{PCONT}$.

FIG. 8 shows the RF communications terminal 10 applying a correction for a receiver DC offset to the RF input signal $RF_{IN}$, and applying a correction for a detector DC offset to the detected output power signal $V_{DOP}$, according to a third embodiment of the present invention. Any or all of the embodiments of the present invention associated with the RF communications terminal 10 illustrated in FIG. 1 may be combined with any or all of the embodiments of the present invention associated with the RF communications terminal 10 illustrated in FIG. 4.

FIG. 9 is a graph illustrating the estimated amplitude signal $V_{ESTAM}$, such that the first threshold $V_{TH1}$ and the second threshold $V_{TH2}$ are unequal, according to one embodiment of the RF communications terminal 10 illustrated in FIG. 8. The instantaneous amplitude of the continuous-transmission AM RF signal $RF_{CTAM}$ that is significant relative to the receiver DC offset may be different from the instantaneous amplitude of the continuous-transmission AM RF signal $RF_{CTAM}$ that is significant relative to the detector DC offset. Therefore, the first and second thresholds $V_{TH1}$, $V_{TH2}$ may be unequal. In an alternate embodiment of the present invention, the instantaneous amplitude of the continuous-transmission AM RF signal $RF_{CTAM}$ that is significant relative to the receiver DC offset may be about equal to the instantaneous amplitude of the continuous-transmission AM RF signal $RF_{CTAM}$ that is significant relative to the detector DC offset. Therefore, the first and second thresholds $V_{TH1}$, $V_{TH2}$ may be about equal.

FIG. 10 shows details of the RF receiver 14 illustrated in FIG. 8, according to one embodiment of the present invention. The RF input signal $RF_{IN}$ feeds down conversion circuitry 48, which down converts the RF input signal $RF_{IN}$ into a down converted signal $V_{DCV}$, which is an analog signal. The down converted signal $V_{DCV}$ feeds a first analog-to-digital converter 50, which converts the analog down converted signal $V_{DCV}$ into the received signal $V_{RX}$, which is a digital signal. In alternate embodiments of the present invention, the down conversion circuitry 48, the first analog-to-digital converter 50, or both may be omitted.

FIG. 11 shows the power detection circuitry 34 of the RF communications terminal 10 illustrated in FIG. 8 providing a temperature signal $V_{TEMP}$ to the control circuitry 20, according to one embodiment of the present invention. The temperature signal $V_{TEMP}$ is based on the temperature of the power detection circuitry 34. The control circuitry 20 may estimate the detector DC offset to create an estimated temperature based detector DC offset based on the temperature signal $V_{TEMP}$. The estimated temperature based detector DC offset may be based on previously collected data relating the detector DC offset to the temperature of the power detection circuitry 34. The control circuitry 20 may then estimate the detector DC offset based on both the detected output power signal $V_{DOP}$ and the temperature signal $V_{TEMP}$.

FIG. 12 shows the power detection circuitry 34 of the RF communications terminal 10 illustrated in FIG. 8 providing a combined signal $V_{COMB}$ to the control circuitry 20, according to an alternate embodiment of the present invention. The control circuitry 20 provides a select signal $V_{SEL}$ to the power detection circuitry 34. The combined signal $V_{COMB}$ may be based on either the detected output power signal $V_{DOP}$ (not shown) or the temperature signal $V_{TEMP}$ (not shown), depending on the select signal $V_{SEL}$.

FIG. 13 shows details of the power detection circuitry 34 illustrated in FIG. 12, according to one embodiment of the present invention. An RF coupler 52 is coupled between the RF transmitter 12 and the duplexer 18, and provides a coupled signal $V_{CPL}$ to an RF power detector 54 based on the continuous-transmission AM RF signal $RF_{CTAM}$. The RF power detector 54 detects the transmitted power associated with the continuous-transmission AM RF signal $RF_{CTAM}$ based on the coupled signal $V_{CPL}$. The RF power detector 54 provides an analog detected output power signal $V_{ADOP}$ to a multiplexer 56 based on the detected transmitted power.

Temperature measurement circuitry 58 provides an analog temperature signal $V_{ATEMP}$ to the multiplexer 56. The analog temperature signal $V_{ATEMP}$ is based on the temperature of the power detection circuitry 34. The multiplexer 56 provides a multiplexer output signal $V_{MUXO}$ based on either the analog detected output power signal $V_{ADOP}$ or the analog temperature signal $V_{ATEMP}$, depending on the select signal $V_{SEL}$. A second analog-to-digital converter 60 converts the multiplexer output signal $V_{MUXO}$ into the combined signal $V_{COMB}$, which is a digital signal. In alternate embodiments of the present invention, the second analog-to-digital converter 60 may be omitted.

FIGS. 14A, 14B, and 14C illustrate the continuous-transmission AM RF signal $RF_{CTAM}$, an average output power $P_{AO}$ of the continuous-transmission AM RF signal $RF_{CTAM}$, and the estimated amplitude signal $V_{ESTAM}$ of the RF communications terminal 10 illustrated in FIG. 8, respectively, according to one embodiment of the present invention. Some communications protocols continuously transmit sequential communications slots, one after the other. Adjacent communications slots may be separated in time by slot boundaries. For example, the continuous-transmission AM RF signal $RF_{CTAM}$ may transmit an Nth slot 62, followed by a slot boundary 64 having a slot duration 66, which may be followed by an N+1st slot 68. During the slot boundary 64, the continuous-transmission AM RF signal $RF_{CTAM}$ may be interrupted during an interrupt event 70 to allow estimation of the detector DC offset, the receiver DC offset, or both, as illustrated in FIG. 14A.

The time duration of the interrupt event 70 is an interrupt duration 72, as illustrated in FIG. 14B. During the interrupt event 70, the average output power $P_{AO}$ may ramp down from a first power level $P_1$ to about zero, may be held at zero for a zero power duration 74 to allow time for estimation of the detector DC offset and to allow time for determination of a second power level $P_2$ based on the estimated detector DC offset, and may ramp up from about zero to the second power level $P_2$. The time duration of the ramp down is a ramp down duration 76 and the time duration of the ramp up is a ramp up duration 78.

In a first exemplary embodiment of the present invention, the slot duration 66 may be about 25 microseconds and the interrupt duration 72 may be less than about eight microseconds. In a second exemplary embodiment of the present invention, the slot duration 66 may be about 25 microseconds, the interrupt duration 72 may be about six microseconds, the zero power duration 74 may be about four microseconds, the ramp down duration 76 may be about one microsecond, and the ramp up duration 78 may be about one microsecond. During the zero power duration 74, the first and second thresholds are $V_{TH1}$, $V_{TH2}$ are greater than the estimated amplitude signal $V_{ESTAM}$, which may meet some or all of the criteria needed to enable estimation of the detector DC offset, the receiver DC offset, or both, as illustrated in FIG. 14C.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, digital signal processors (DSPs), the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) communications terminal comprising:
  an RF transmitter adapted to transmit a continuous-transmission amplitude-modulated (AM) RF signal;
  an RF receiver adapted to receive an RF input signal and provide a received signal based on the RF input signal and a first receiver direct current (DC) offset of the RF receiver; and
  control circuitry adapted to
    estimate the first receiver DC offset based on the received signal when:
      the RF receiver is not receiving the RF input signal; and
      an estimated instantaneous amplitude of the continuous-transmission AM RF signal is less than a first threshold; and
    provide a corrected received signal based on the received signal and the estimated first receiver DC offset.

2. The RF communications terminal of claim 1 wherein the estimated instantaneous amplitude of the continuous-transmission AM RF signal is continuously less than the first threshold.

3. The RF communications terminal of claim 1 wherein the continuous-transmission AM RF signal is a polar-modulated RF signal.

4. The RF communications terminal of claim 1 wherein the continuous-transmission AM RF signal is a wideband code division multiple access (WCDMA) transmit RF signal.

5. The RF communications terminal of claim 1 wherein the continuous-transmission AM RF signal is a single-carrier frequency division multiple access (SC-FDMA) transmit RF signal.

6. The RF communications terminal of claim 1 wherein:
  the control circuitry is further adapted to estimate a second receiver DC offset of the RF receiver when the continuous-transmission AM RF signal is disabled; and
  the estimated first receiver DC offset is further based on the estimated second receiver DC offset.

7. The RF communications terminal of claim 1 wherein:
  the RF transmitter is further adapted to interrupt the continuous-transmission AM RF signal during slot boundaries between communications slots; and
  the control circuitry is further adapted to estimate the first receiver DC offset during the interruption of the continuous-transmission AM RF signal.

8. The RF communications terminal of claim 7 wherein a duration of the interruption of the continuous-transmission AM RF signal is less than about eight microseconds.

9. The RF communications terminal of claim 1 further comprising a duplexer coupled between the RF transmitter and the RF receiver.

10. The RF communications terminal of claim 1 wherein the received signal is further based on a down conversion of the RF input signal.

11. The RF communications terminal of claim 1 wherein the RF receiver further comprises a receiver analog-to-digital converter adapted to:
receive an analog signal based on the RF input signal; and
convert the analog signal into a digital signal, which provides the received signal.

12. The RF communications terminal of claim 1:
further comprising a power detection circuit adapted to provide a detected output power signal based on an amplitude of the continuous-transmission AM RF signal and a first detector DC offset of the power detection circuit; and
wherein the RF transmitter is further adapted to transmit the continuous-transmission AM RF signal at an average output power, and the control circuitry is further adapted to:
estimate the first detector DC offset based on the detected output power signal when the estimated instantaneous amplitude of the continuous-transmission AM RF signal is less than a second threshold; and
estimate the average output power based on the detected output power signal and the estimated first DC offset; and
regulate the average output power based on the estimated average output power and a first setpoint.

13. The RF communications terminal of claim 12:
further comprising temperature measurement circuitry adapted to provide a temperature signal based on a temperature of the power detection circuit; and
wherein the estimated first detector DC offset is further based on the temperature signal.

14. The RF communications terminal of claim 12:
further comprising temperature measurement circuitry adapted to provide a temperature signal based on a temperature of the power detection circuit; and
wherein the detected output power signal is further based on the temperature signal.

15. The RF communications terminal of claim 12 wherein the estimated instantaneous amplitude of the continuous-transmission AM RF signal is based on the detected output power signal.

16. The RF communications terminal of claim 12 wherein:
the control circuitry is further adapted to provide an amplitude modulation signal; and
the continuous-transmission AM RF signal is based on the amplitude modulation signal.

17. The RF communications terminal of claim 16 wherein the estimated instantaneous amplitude of the continuous-transmission AM RF signal is based on the amplitude modulation signal.

18. The RF communications terminal of claim 17 wherein the estimated instantaneous amplitude of the continuous-transmission AM RF signal is further based on an estimated delay between the amplitude modulation signal and the detected output power signal.

19. The RF communications terminal of claim 17 wherein the estimated first detector DC offset is further based on the estimated instantaneous amplitude of the continuous-transmission AM RF signal when the estimated instantaneous amplitude of the continuous-transmission AM RF signal is less than the second threshold.

20. The RF communications terminal of claim 19 wherein the estimated first detector DC offset is further based on an average of the estimated instantaneous amplitude of the continuous-transmission AM RF signal when the estimated instantaneous amplitude of the continuous-transmission AM RF signal is less than the second threshold.

21. The RF communications terminal of claim 19:
further comprising temperature measurement circuitry adapted to provide a temperature signal based on a temperature of the power detection circuit; and
wherein the estimated first detector DC offset is further based on the temperature signal.

22. The RF communications terminal of claim 12 wherein:
the control circuitry is further adapted to estimate a second detector DC offset of the power detection circuit when the continuous-transmission AM RF signal is disabled; and
the estimated first detector DC offset is further based on the estimated second detector DC offset.

23. The RF communications terminal of claim 12 wherein the second threshold is based on the estimated average output power.

24. The RF communications terminal of claim 1 wherein the control circuitry is further adapted to estimate the first receiver DC offset based on an average of the received signal.

25. A method for operating a radio frequency (RF) communications terminal comprising:
transmitting a continuous-transmission amplitude-modulated (AM) RF signal at an average output power;
providing an RF receiver, which has a first receiver direct current (DC) offset and is adapted to receive an RF input signal;
providing a received signal based on the RF input signal and the first receiver DC offset;
estimating the first receiver DC offset based on the received signal when:
the RF receiver is not receiving the RF input signal; and
an estimated instantaneous amplitude of the continuous-transmission AM RF signal is less than a first threshold; and
providing a corrected receive signal based on the received signal and the estimated first receiver DC offset.

* * * * *